United States Patent
Nickel et al.

(10) Patent No.: US 6,756,239 B1
(45) Date of Patent: Jun. 29, 2004

(54) METHOD FOR CONSTRUCTING A MAGNETO-RESISTIVE ELEMENT

(75) Inventors: Janice H. Nickel, Sunnyvale, CA (US); Thomas Anthony, Sunnyvale, CA (US); Manish Sharma, Sunnyvale, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/414,325

(22) Filed: Apr. 15, 2003

(51) Int. Cl.[7] .............................................. H01L 21/00
(52) U.S. Cl. ................................................ 438/3
(58) Field of Search .......................................... 438/3

(56) References Cited

U.S. PATENT DOCUMENTS

| | | | | |
|---|---|---|---|---|
| 5,569,617 A | * | 10/1996 | Yeh et al. | 438/3 |
| 5,640,343 A | | 6/1997 | Gallagher et al. | |
| 6,519,179 B2 | * | 2/2003 | Minakata et al. | 365/171 |
| 6,607,924 B2 | * | 8/2003 | Brug et al. | 438/3 |
| 6,635,499 B1 | * | 10/2003 | Signorini | 438/3 |
| 2002/0036331 A1 | | 3/2002 | Nickel et al. | |

OTHER PUBLICATIONS

J.M. Slaughter, et al, *Magnetic Tunnel Junction Materials for Electronic Applications*, JOM, JOM–3, 52 (6) 2000, http://www.tms.org/pubs/journals/JOM/0006/Slaughter/Slaughter–0006.html. Jun. 2000.

Caroline A. Ross, et al. *Making Nanoscale Magnetic Elements for Magnetic Random Access Memories*, NSF Partnership in Nanotechnology Conference, Jan. 29&30, 2001.

* cited by examiner

*Primary Examiner*—David Nelms
*Assistant Examiner*—Thao P. Le

(57) ABSTRACT

A magneto-resistive element is constructed. A ferromagnetic sense layer is deposited on a surface. The ferromagnetic sense layer is patterned. An etch is performed in preparation for depositing a dielectric layer. The dielectric layer is deposited over the sense layer. A ferromagnetic pinned layer is deposited over the dielectric layer.

28 Claims, 10 Drawing Sheets

METHOD FOR CONSTRUCTING A MAGNETO-RESISTIVE ELEMENT

BACKGROUND

A magnetic random access memory (MRAM) is a solid-state non-volatile magnetic storage device. Bits of data are stored in small magneto-resistive elements. For example, in a magnetic tunnel junction (MTJ) magneto-resistive element, two ferromagnetic layers, a pinned magnetic layer and a sense magnetic layer, are separated by an insulating tunnel barrier. Magnetoresistance results from the spin-polarized tunneling of conduction electrons between the ferromagnetic layers. The tunneling current depends on the relative orientation of the magnetic moments of the two-ferromagnetic layers.

The magnetization orientation of the sense layer is used for information storage. The resistance is either low or high, depending on the relative orientation of sense magnetic layer with respect to the pinned magnetic layer. The orientation is either parallel (P) or antiparallel (AP).

In an MRAM array, orthogonal lines pass under and over the magneto-resistive elements, carrying current that produces switching fields. The magneto-resistive elements are designed so that the magnetization of the sense magnetic layer will not switch when current is applied to just one line, but will switch when current is applied to both lines. A magneto-resistive element is manufactured using series of layers of material stacked on top of one another. A pinned layer can be either on the bottom or top of the tunnel junction layer. The sense layer is required to be patterned in two dimensions in order to define a discrete bit. When the pinned layer is on the bottom, the pinned layer can be defined in two dimensions (i.e., is "patterned") or can be defined along one dimension (i.e., is "unpatterned"). What is meant by "unpatterned" is that the pinned layer is defined in only one dimension and not defined in the other dimension so that the resulting structure is a line. When the pinned layer is patterned, it is typically patterned at the point in the manufacturing process when the sense layer is patterned. When the pinned layer is to remain unpatterned, the sense layer is patterned and the patterning process is controlled so that the pinned layer is not patterned by the sense layer patterning process.

If the pinned layer is patterned, it contributes to the magnetic state of the sense layer. This magnetic contribution is often referred to as the "demagnetization field". This demagnetization field needs to either be eliminated or tightly controlled.

The pinned layer is generally composed of a set of several material layers that have some lattice mismatch. Strain relaxation and the resultant columnar grain growth creates morphological roughness. This roughness contributes to the magnetic state of the sense layer. This contribution is sometimes referred to as the "coupling field" or "Ne'el coupling". The coupling field also needs to be either eliminated or tightly controlled.

One solution to reduce the coupling field is to put the sense layer on the bottom of the stack, thereby reducing the Ne'el coupling due to the roughness of the pinned stack. In this case, the pinned layer is patterned in order to perform patterning of the sense layer. As discussed above, the patterned pinned layer will then contribute to the demagnetization field.

Additionally, when the pinned layer is patterned, the sense layer of the completed magneto-resistive element will switch polarity using different mechanisms. When the sense layer switches from P to AP (low resistance to high resistance state switching), the predominant mechanism is the growth of end domains. When the sense layer switches from AP to P (high resistance to low resistance state switching), the mechanism used is the growth of a domain from somewhere in the middle of the sense layer. The AP to P switching has an unstable nucleation mechanism due to probabilistic switching nucleated by surface irregularities and/or roughness. This unpredictable nucleation mechanism in a patterned pinned layer junction causes variations in the switching field over many bits and also for multiple cycling of the same bit.

A magneto-resistive element with an unpatterned pinned layer always switches by the same mechanism. Thus, the switching of a magneto-resistive element that has a patterned pinned layer has an increased switching distribution relative to a magneto-resistive element that has an unpatterned pinned layer.

SUMMARY OF THE INVENTION

In accordance with the preferred embodiment of the present invention a magneto-resistive element is constructed. A ferromagnetic sense layer is deposited on a surface. The ferromagnetic sense layer is patterned. An ion etch is performed in preparation for depositing a dielectric layer. The dielectric layer is deposited over the sense layer. A ferromagnetic pinned layer is deposited over the dielectric layer.

DESCRIPTION OF THE PREFERRED EMBODIMENT

Figure 1:
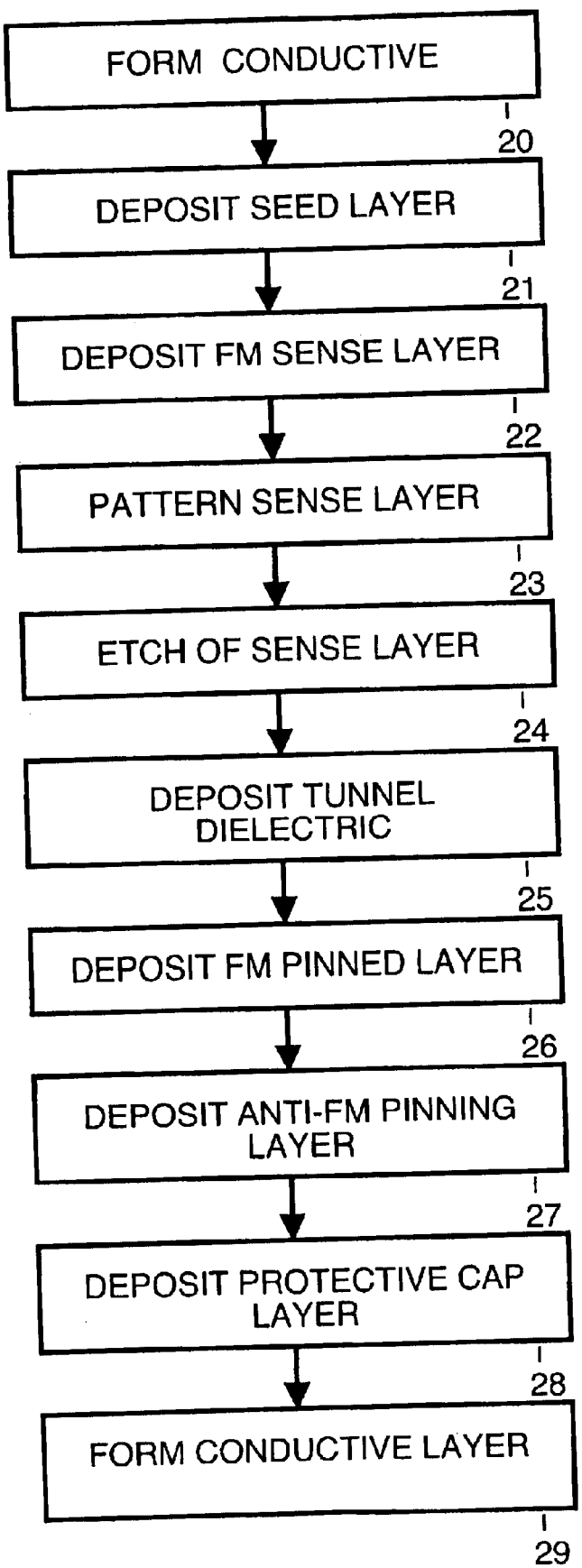
FIG. 1 is a flowchart that describes construction of a magneto-resistive element in accordance with a preferred embodiment of the present invention.

FIG. 1 is a flowchart that describes construction of a magneto-resistive element. In a processing step 20, a conductive layer 9 (shown in FIG. 2) is formed. For example, conductive layer 9 is formed using a damascene process. In a processing step 21, a seed layer 11 (Shown in FIG. 2) is deposited on a conductive layer 9 on a top surface of wafer 10. For example, seed layer 11 is typically in the range of 2 nanometers (nm) to 5 nm thick and composed of tantalum (Ta), copper (Cu) ruthenium (Ru), tantalum nitride (TaN), titanium (Ti), platinum (Pt) or some other suitable material. Although shown as two distinct layers, it is possible for conductive layer 9 and seed layer 11 to be combined in a single layer.

Figure 2:
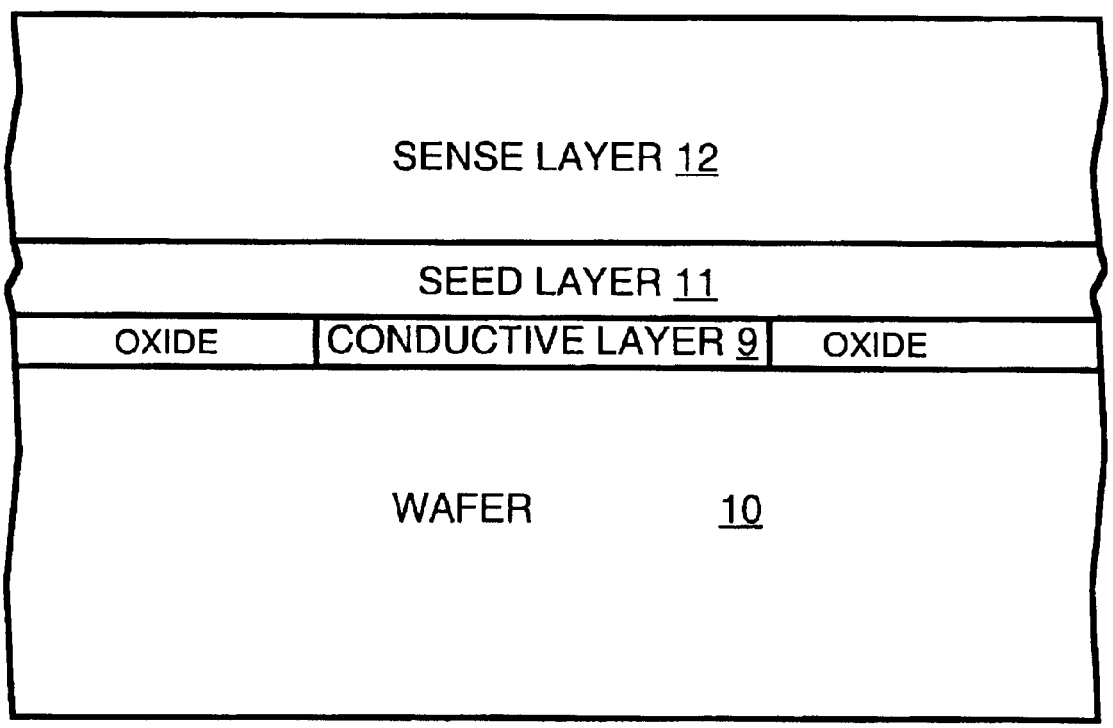
FIG. 2, FIG. 3, FIG. 4, FIG. 5 and FIG. 6 illustrate construction of the magneto-resistive element in accordance with the preferred embodiment of the present invention.

In a processing step 22, a ferromagnetic (FM) sense layer 12 (shown in FIG. 2) is deposited. FM sense layer 12 is composed of cobalt (Co), iron (Fe), nickel (Ni), an alloy containing one of the aforementioned elements, or some other suitable material. The result is shown in FIG. 2 where seed layer 11 and FM sense layer 12 are shown deposited on conductive layer 9 on a top surface of wafer 10.

In processing step 22, the FM material deposited for sense layer 12 is intentionally deposited thicker than the desired thickness. For example, the desired final thickness of FM sense layer 12 is 3 nm to 6 nm, but the deposited thickness is 5 nm to 10 nm.

In alternative embodiment, FM sense layer 12 consists of two FM materials, the second having a high spin polarization, so as to give a high signal. For example, the first FM material is composed of NiFe and the second FM material is composed of CoFe. For example, the first FM material is deposited to a thickness of 3 nm, and the second FM material is deposited to a thickness of 3 nm which is etched back to 1 nm.

Alternatively, in step 22, FM sense layer 12 can consist of a synthetic ferrimagnet (SF), also called an artificial antiferromagnet (AAF). An SF is typically composed of two ferromagnetic films FM1 and FM2 separated by a thin non-magnetic layer where the thickness of the non-magnetic layer is such that the ferromagnetic films are coupled very strongly with their magnetic moments in opposite directions. The non-magnetic layer is typically ruthenium (Ru), rhodium (Rh), silicon (Si) or other suitable material. The thickness of the two ferromagnetic films FM1 and FM2 are different, such that the SF has a net magnetic moment that interacts with an applied field.

Figure 3:
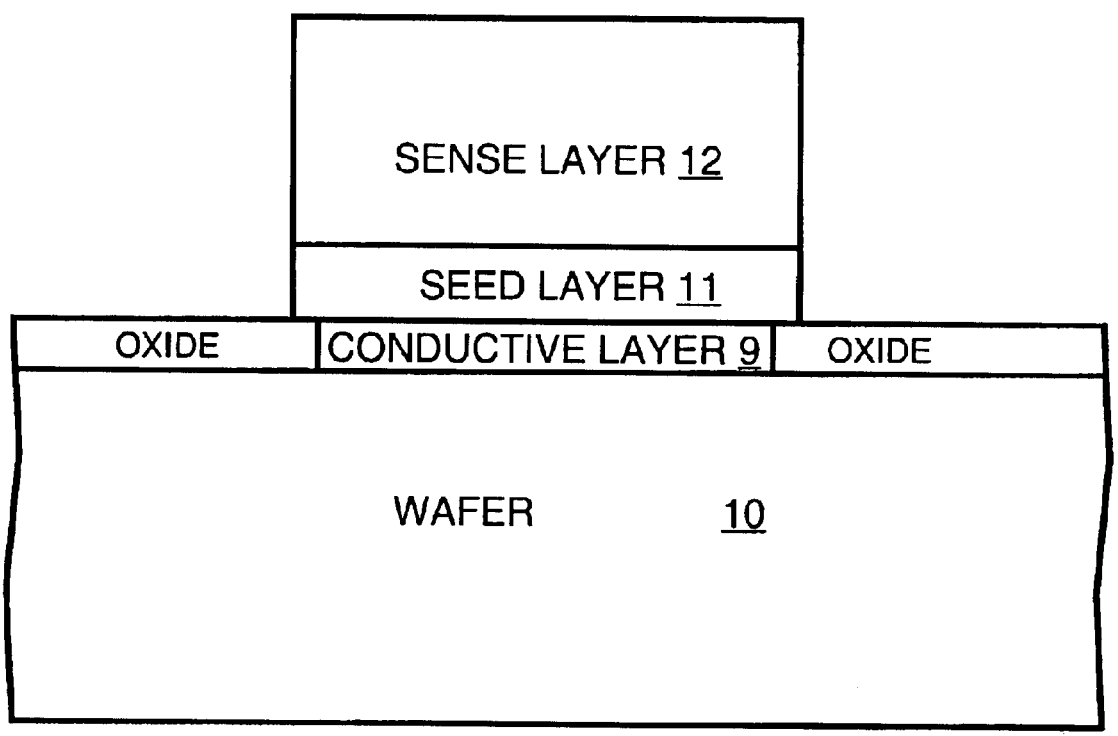

In a processing step 23, FM sense layer 12 and seed layer 11 are patterned, for example, by lithographic and etch processes. The result is shown in FIG. 3 where FM sense layer 12 and seed layer 11 are shown having been patterned. To perform the patterning, wafer 10 is removed from the deposition chamber, typically requiring breaking vacuum. However, breaking vacuum between layer depositions can degrade the quality of subsequent layers due to the formation of native oxide or incorporation of contaminants, defects and impurities. Magnetic tunnel junctions are known to be sensitive to the cleanliness of the interfaces between ferromagnetic and dielectric films in the structure. In the preferred embodiment, the sense layer 12 is patterned slightly larger (in one dimension) than the underlying conductor 9.

Figure 4:
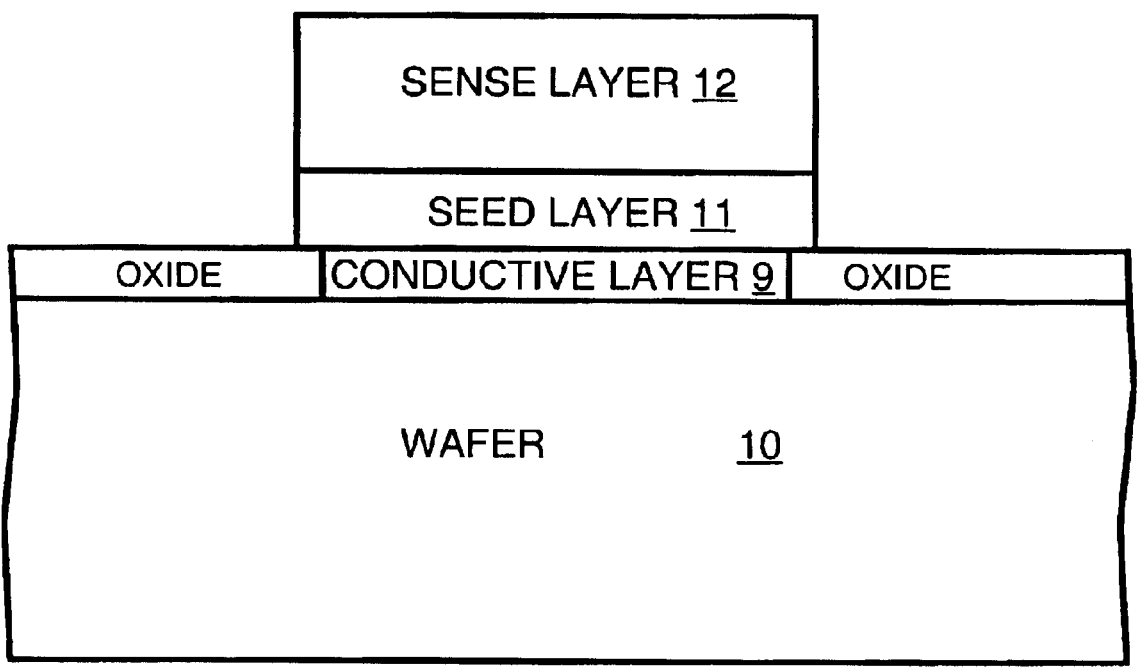

Once returned to the deposition chamber, in a processing step 24, an etch is performed on sense layer 12 to remove defects and impurities and to achieve the final thickness of 1 nm to 6 nm. For example, the etch can be an ion etch, or some other type of etch, such as neutral atom sputter etch. The thickness of material to be etched back is chosen such that etching the material removes any native oxide or contaminants, and produces a smooth layer. The etch process also smoothes the surface of FM sense layer 12 with the result that the remaining portion of FM sense layer 12 is in a pristine condition, ready for deposition of the remaining materials stack. The result is shown in FIG. 4.

In a processing step 25, a tunnel dielectric 13 (shown in FIG. 5) is formed. For example, tunnel dielectric 13 is typically 1 nm to 2 nm thick and composed of aluminum oxide ($Al_2O_3$), aluminum nitride (AlN), boron nitride (BN), or some other suitable material. Tunnel dielectric 13 can be formed by direct deposition of the insulating material, or by depositing a precursor metal, such as Al, and converting it into a dielectric by chemical reaction. An example of a metallic layer converted is conversion of metallic Al to dielectric $Al_2O_3$ by reaction of Al with oxygen. Typically, reaction enhancing processes such as generating a plasma, or heating the substrate are employed. Tunnel dielectric 13 coats all exposed surfaces, including sidewalls, of sense layer 12.

In a processing step 26, an FM pinned layer 14 (shown in FIG. 5) is deposited. For example, pinned layer 14 is 1 nm to 6 nm thick and composed of cobalt (Co), iron (Fe), nickel (Ni), an alloy containing one of the aforementioned elements or some other suitable material.

Alternatively, in step 26, FM pinned layer 14 can consist of a ferrimagnet (SF). An SF is typically composed of two ferromagnetic films separated by a thin non-magnetic spacer-layer where the thickness of the non-magnetic layer is such that the ferromagnetic films are coupled very strongly with their magnetic moments in opposite directions. The non-magnetic layer is typically ruthenium (Ru) rhodium (Rh), silicon (Si) or other suitable material. Generally, for use in the pinned layer, the two FM films are slightly different thicknesses.

In a processing step 27, an antiferromagnetic pinning layer 15 (shown in FIG. 5) is deposited. For example, pinning layer 15 is 7 nm to 10 nm thick and composed of iridium manganese (IrMn), iron manganese (FeMn), platinum manganese (PtMn) or some other suitable material.

In a processing step 28, a protective cap layer 16 (shown in FIG. 5) is deposited. For example, protective cap layer 16 is approximately 5 nm thick and composed of tantalum (Ta), ruthenium (Ru), tantalum nitride (TaN), titanium (Ti), platinum (Pt) or some other suitable material. Often protective cap layer 16 is composed of the same material as seed layer 21.

Figure 5:
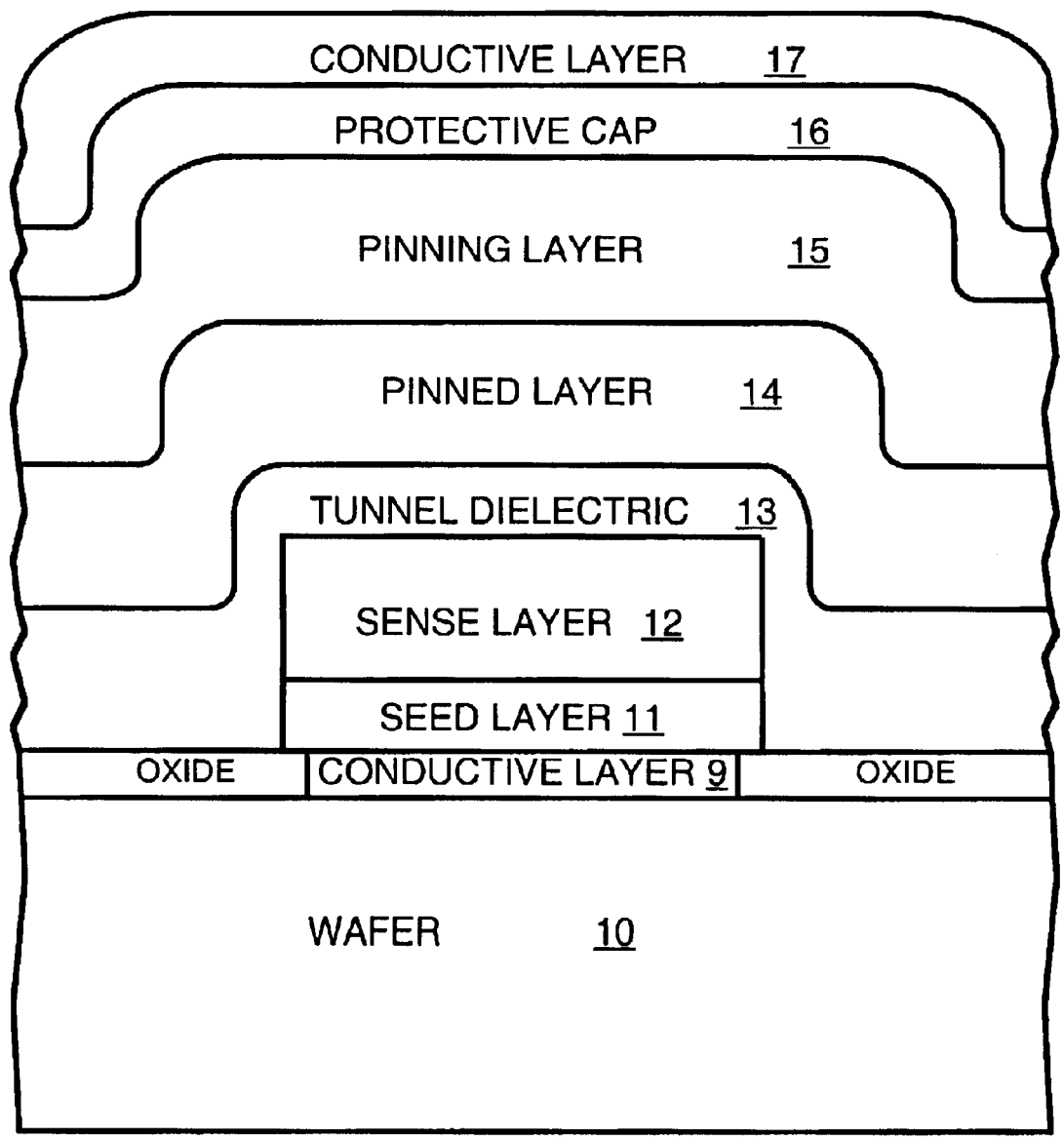

In a processing step 29, a conductive layer 17 is formed. This is done, for example, by depositing and patterning a conductive material. Typically, pinned layer 14, pining layer 15 and protective cap 16 are patterned along with the conductive material. The result is shown in FIG. 5 and FIG. 6.

Figure 6:
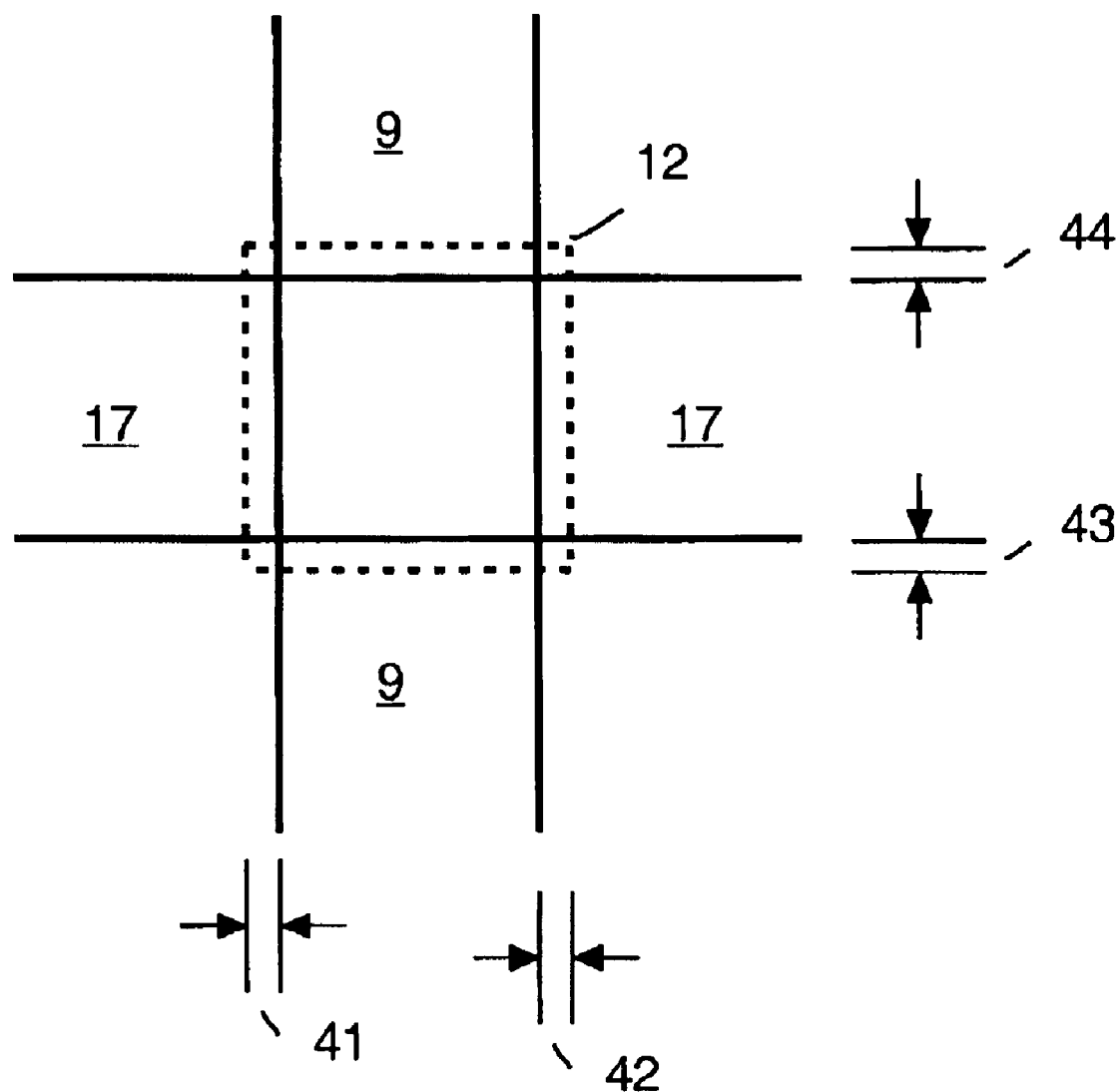

FIG. 6 shows a top view of the intersection of conductive layer 9 and conductive layer 17. The patterned geometry of pinned layer 14, pining layer 15 and protective cap 16 is the same as conductive layer 17. The geometry of sense layer 12 is shown by a dotted line. As can be seen by the dotted line, sense layer 12 overlaps conductor 17 by a distance 41 and a distance 42. Sense layer 12 overlaps conductor 9 by a distance 43 and a distance 44.

When implementing the process steps shown in FIG. 1, it is desirable to minimize electrical conduction between pinned layer 14 and conductive layer 9 (or seed layer 11 if there is no separate conductive layer). One way to minimize conduction is to constrain the geometry of the magnetic tunnel junction so that there is no overlap of pinned layer 14 and conductive layer 9, as shown in FIG. 6.

Geometric isolation is the simplest method to prevent unwanted electrical conduction, but there are other methods. For example, an additional isolation dielectric layer can be inserted between conductive layer 9 and pinned layer 14 in regions of potential overlap. The additional isolation dielectric layer can be, for example, a deposited film or a portion of a metallic layer converted by chemical reaction. An example of a metallic layer converted by chemical reaction is conversion of metallic Ta to dielectric $Ta_2O_5$ by reaction of Ta with oxygen. Increasing the thickness of the additional isolation dielectric layer over the conductive layer 9 permits overlap of pinned layer 14 and first conductive layer 9. Tunneling current across an insulator drops exponentially with increasing insulator thickness, so a very small increase in thickness is sufficient to block conduction between the metal layers.

Figure 7:
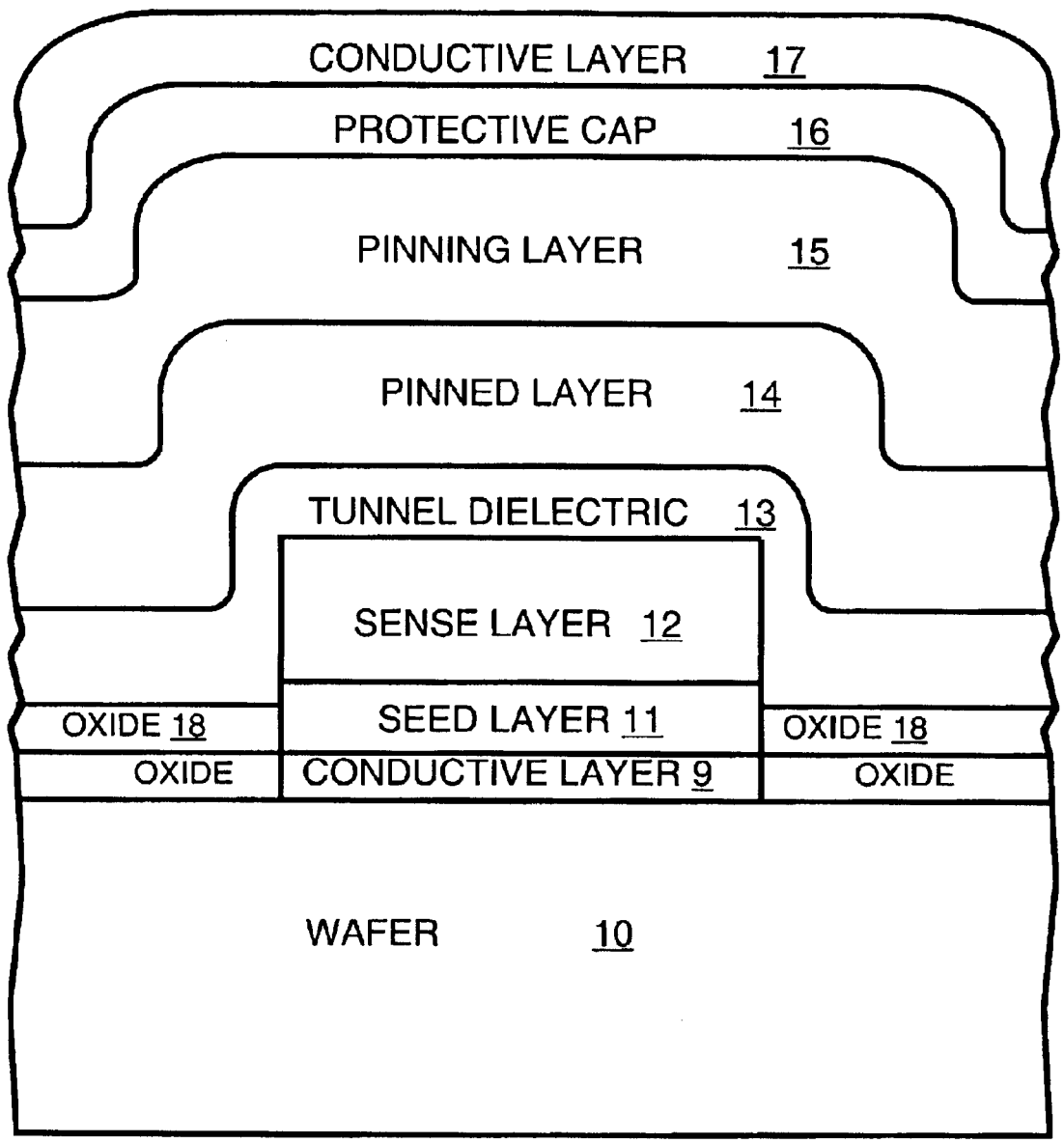
FIG. 7 illustrates construction of the magneto-resistive element in accordance with an alternative preferred embodiment of the present invention.

For example, in an alternative embodiment, sense layer 12 does not overlap conductor 9 or conductor layer 17. In this embodiment, an additional oxide deposition or a spacer process after sense layer is patterned in processing step 23. As discussed above, this is necessary because it is not sufficient to have pinned layer 14 separated from conductive layer 9 only by tunnel dielectric 13. As shown in FIG. 7 an additional oxide deposition performed after sense layer results in oxide regions 18 isolating conductive layer 9 from tunnel dielectric 13. In this embodiment, conductive layer 9 and seed layer 11 can be implemented as a single layer (i.e., the conductive layer also acts as the seed layer).

Figure 8:
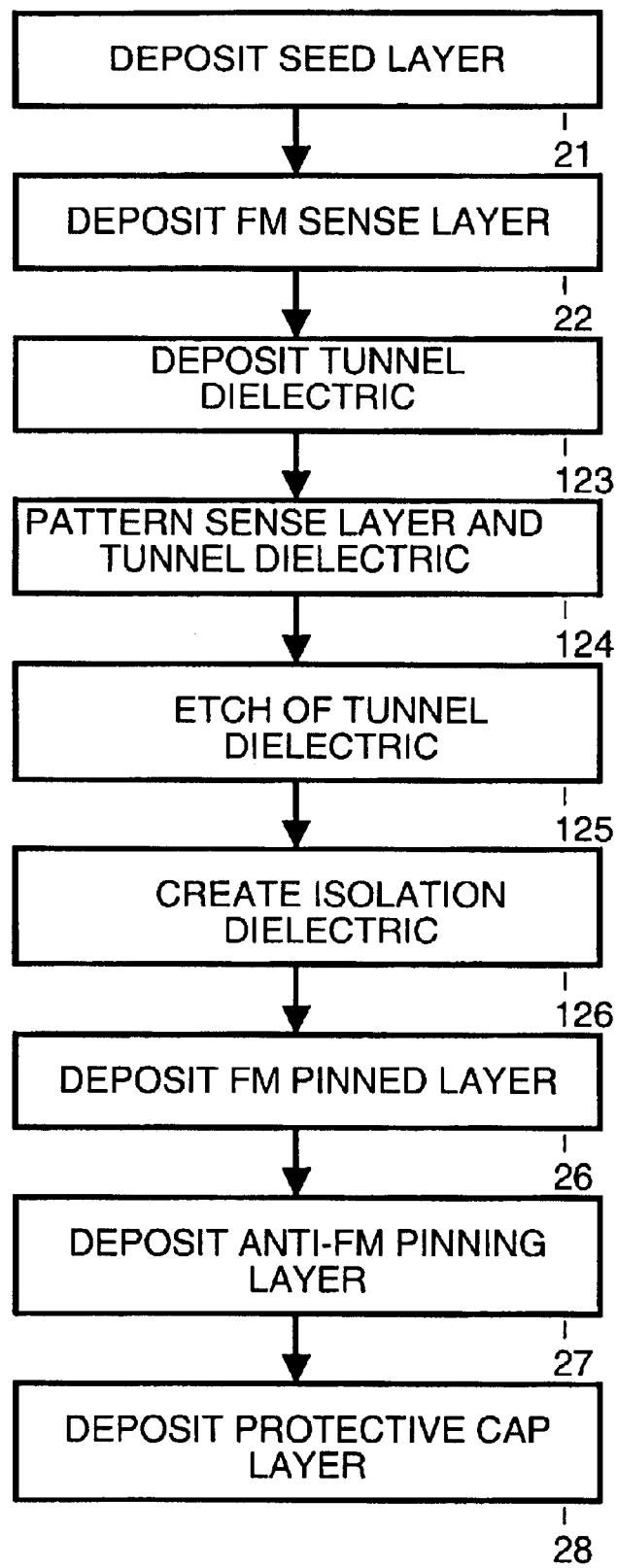
FIG. 8 is a flowchart that describes construction of a magneto-resistive element in accordance with another alternative preferred embodiment of the present invention.
Figure 9:
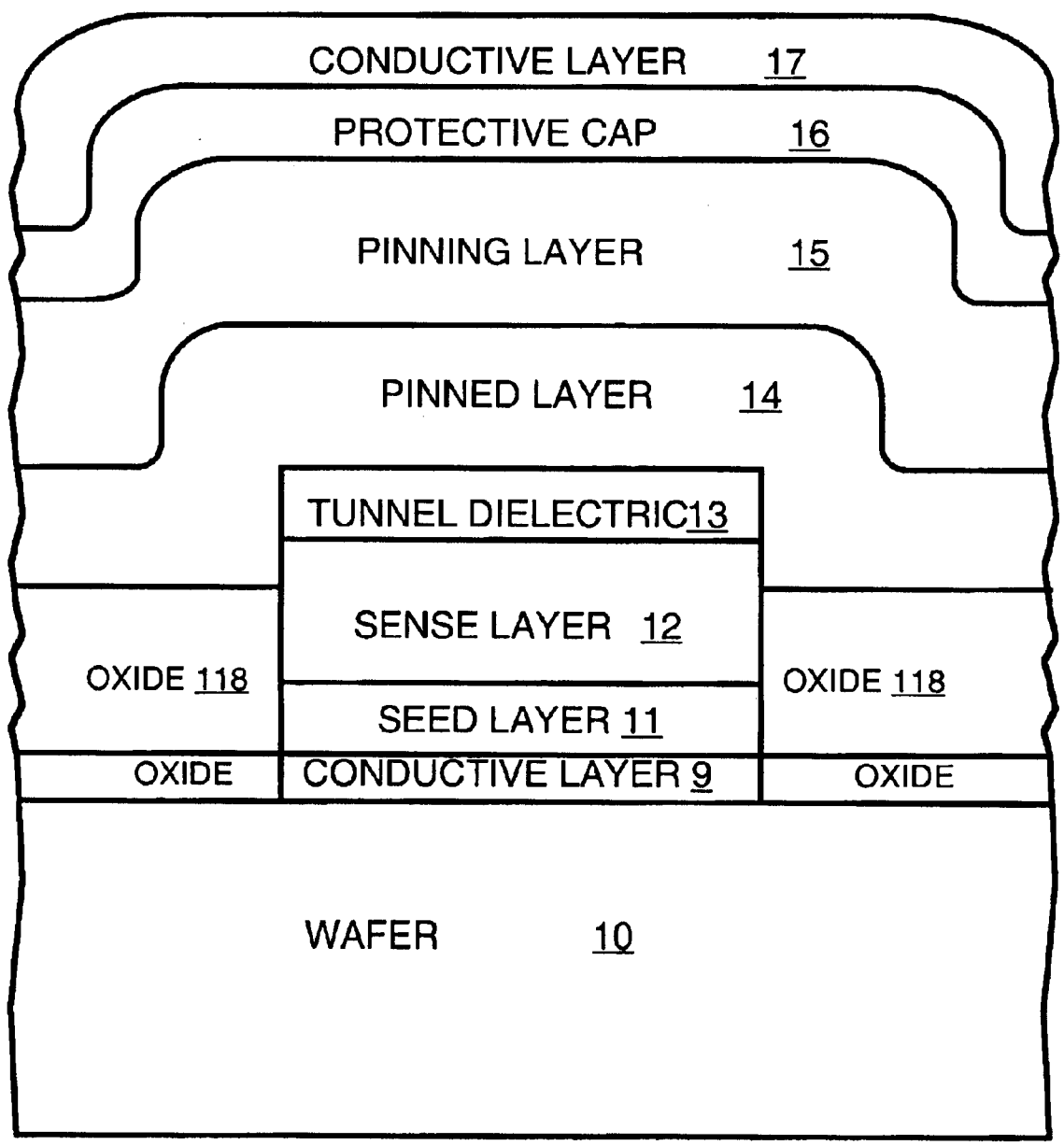
FIG. 9 illustrates construction of the magneto-resistive element in accordance with another alternative preferred embodiment of the present invention.

FIG. 8 illustrates an alternative embodiment of the present invention. In the alternative embodiment, processing step 21 and processing step 22 are performed as described above, except however, in processing step 22, the FM material deposited for FM sense layer 12 is deposited at approximately the desired thickness. In a processing step 123, tunnel dielectric 13 is deposited over sense layer 12 before patterning is performed. In a step 124, tunnel dielectric 13 and sense layer 12 are patterned. In step 123, tunnel dielectric 13 is deposited to greater than the required thickness. Once the wafer is returned to the deposition chamber after patterning, in a step 125, an etch is performed to remove defects and impurities from tunnel dielectric 13 and to achieve the required thickness of tunnel dielectric 13. For example, the etch can be an ion etch, or some other type of etch, such as neutral atom sputter etch. In a processing step 126, isolation dielectric regions 118 are formed, for example, by deposition or oxidation of seed layer 11. Processing steps 26, 27 and 28 are then performed, as described above. In another alternative embodiment, in processing step 123, tunnel dielectric 13 is deposited to the desired thickness and processing step 125 is skipped. The result is shown in FIG. 9.

Figure 10:
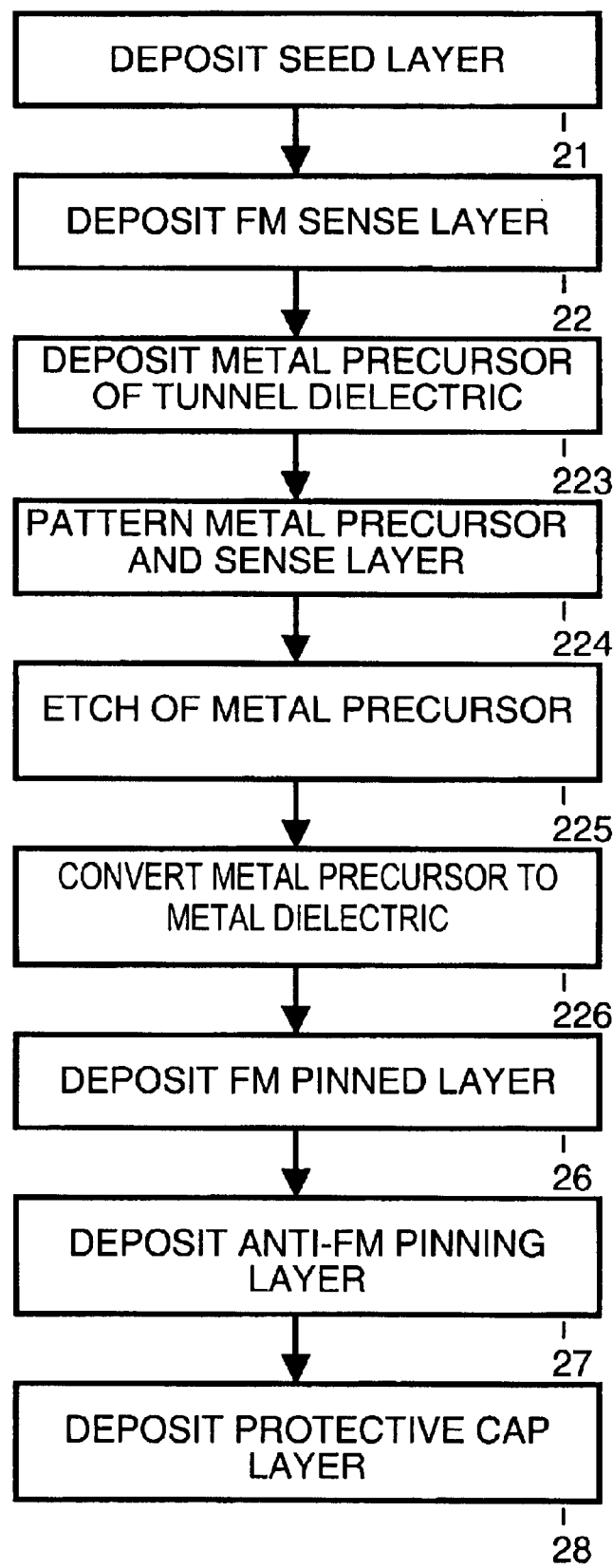
FIG. 10 is a flowchart that describes construction of a magneto-resistive element in accordance with another alternative preferred embodiment of the present invention.

FIG. 10 illustrates an alternative embodiment of the present invention. In the alternative embodiment, processing step 21 and processing step 22 are performed as described above, except however, in processing step 22, the FM material deposited for FM sense layer 12 is deposited at approximately the desired thickness. In a processing step 223, a metal precursor to tunnel dielectric 13 is deposited over sense layer 12 before patterning is performed, In step 223, metal precursor of tunnel dielectric 13 is deposited to greater than the required thickness. In a step 224, metal precursor of tunnel dielectric 13 and sense layer 12 are patterned. Once the wafer is returned to the deposition chamber after patterning, in a step 225, an etch is performed to remove defects and impurities from metal precursor of tunnel dielectric 13 and to achieve the required thickness of metal precursor to tunnel dielectric 13. For example, the etch can be an ion etch, or some other type of etch, such as neutral atom sputter etch. In process step 226, the metal precursor tunnel dielectric 13 is converted into a dielectric by chemical reaction. An example is conversion of metallic Al to dielectric $Al_2O_3$ by reaction of Al with oxygen. Typically, reaction enhancing processes such as generating a plasma, or heating the substrate are employed. Processing steps 26, 27 and 28 are then performed, as described above.

The disclosed embodiments of the present invention result in improvement both to the switching distribution and magnetic coupling properties of the magnetic tunnel junction. The disclosed embodiments of the present invention also provide a way to pattern sense layer 12 without having to pattern pinned layer 14. The disclosed embodiments of the present invention provide a simplified manufacturing process and produce a simplified structure for an MRAM element.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure is intended to be illustrative, but not limiting, of the scope of the invention, which is set forth in the following claims.

We claim:

1. A method for constructing a magneto-resistive element, the method comprising:
   (a) depositing a ferromagnetic sense layer on a surface;
   (b) patterning the ferromagnetic sense layer;
   (c) performing an etch in preparation for forming a dielectric layer;
   (d) forming the dielectric layer over the sense layer; and,
   (e) depositing a ferromagnetic pinned layer over the dielectric layer.

2. A method as in claim 1 wherein:
   step (a) includes depositing the ferromagnetic sense layer at a thickness greater than a final desired thickness; and,
   step (c) includes performing an etch of the ferromagnetic sense layer until the ferromagnetic sense layer is at the final desired thickness.

3. A method as in claim 1 wherein:
   step (a) includes:
      depositing first ferromagnetic sense material, and
      depositing second ferromagnetic sense material at a thickness greater than a final desired thickness; and,
   step (c) includes performing an etch of the second ferromagnetic sense material until the second ferromagnetic sense material is at the final desired thickness.

4. A method as in claim 1:
   wherein in step (e) the ferromagnetic pinned layer is a synthetic ferrimagnet; and,
   wherein the method additionally comprises the following:
      (f) depositing an anti-ferromagnetic pinning layer over the ferromagnetic pinned layer; and,
      (g) depositing a protective cap layer over the anti-ferromagnetic pinning layer.

5. A method as in claim 1, wherein step (a) includes:
   depositing a seed layer on the surface before depositing ferromagnetic sense material upon the seed layer.

6. A method as in claim 1 additionally comprising the following:
   (f) depositing an antiferromagnetic pinning layer over the ferromagnetic pinned layer.

7. A method as in claim 1 additionally comprising the following:
   (f) depositing an antiferromagnetic pinning layer over the ferromagnetic pinned layer; and,
   (g) depositing a protective cap layer over the antiferromagnetic pinning layer.

8. A method as in claim 1 wherein in step (e) the ferromagnetic pinned layer is a synthetic ferrimagnet.

9. A method as in claim 8 additionally comprising the following:
   (f) depositing a protective cap layer over the ferromagnetic pinned layer.

10. A method as in claim 1:
wherein step (d) includes:
depositing an insulating material.

11. A method as in claim 1:
wherein step (d) includes:
depositing an metal material; and,
exposing the metal material to a gas to form an insulating material.

12. A method as in claim 11:
wherein a reaction enhancing process is employed when exposing the metal material to the gas to form the insulating material.

13. A method as in claim 11:
wherein a reaction enhancing process is employed when exposing the metal material to the gas to form the insulating material, the reaction enhancing process being one of:
a plasma enhancement process; and,
a thermal enhancement process.

14. A method for constructing a magneto-resistive element, the method comprising the followings:
(a) depositing a ferromagnetic sense layer on a surface;
(b) forming a dielectric layer over the ferromagnetic sense layer;
(c) patterning the dielectric layer and ferromagnetic sense layer;
(d) forming isolation dielectric regions on sides of the patterned ferromagnetic sense layer;
(e) performing an etch of the dielectric layer; and,
(f) depositing a ferromagnetic pinned layer over the patterned dielectric layer and the isolation dielectric regions.

15. A method as in claim 14 wherein:
step (b) includes depositing the dielectric layer at a thickness greater than a final desired thickness; and,
step (e) includes performing an etch of the dielectric layer until the dielectric layer is at the final desired thickness.

16. A method for constructing a magnetic random access memory, the method comprising the followings:
(a) depositing a ferromagnetic sense layer on a surface;
(b) patterning the ferromagnetic sense layer to demarcate magneto-resistive elements;
(c) performing an etch in preparation for forming a dielectric layer;
(d) forming the dielectric layer over the sense layer; and,
(e) depositing a ferromagnetic pinned layer over the dielectric layer.

17. A method as in claim 16 wherein:
step (a) includes depositing the ferromagnetic sense layer at a thickness greater than a final desired thickness; and,
step (c) includes performing an etch of the ferromagnetic sense layer until the ferromagnetic sense layer is at the final desired thickness.

18. A method as in claim 16 wherein:
step (a) includes:
depositing first ferromagnetic sense material, and
depositing second ferromagnetic sense material at a thickness greater than a final desired thickness; and,
step (c) includes performing an etch of the second ferromagnetic sense material until the second ferromagnetic sense material is at the final desired thickness.

19. A method as in claim 16, wherein step (a) includes:
depositing a seed layer on the surface before depositing ferromagnetic sense material upon the seed layer.

20. A method as in claim 16 additionally comprising the following:
(f) depositing an antiferromagnetic pinning layer over the ferromagnetic pinned layer.

21. A method as in claim 16 additionally comprising the followings:
(f) depositing an antiferromagnetic pinning layer over the ferromagnetic pinned layer; and,
(g) depositing a protective cap layer over the antiferromagnetic pinning layer.

22. A method as in claim 16 wherein in step (e) the ferromagnetic pinned layer is a synthetic ferrimagnet.

23. A method as in claim 16:
wherein step (d) includes:
depositing an insulating material.

24. A method as in claim 16:
wherein step (d) includes:
depositing an metal material; and,
exposing the metal material to a gas to form an insulating material.

25. A method as in claim 24:
wherein a reaction enhancing process is employed when exposing the metal material to the gas to form the insulating material.

26. A method as in claim 24:
wherein a reaction enhancing process is employed when exposing the metal material to the gas to form the insulating material, the reaction enhancing process being one of:
a plasma enhancement process; and,
a thermal enhancement process.

27. A method for constructing a magnetic random access memory, the method comprising the followings:
(a) depositing a ferromagnetic sense layer on a surface;
(b) forming a dielectric layer over the ferromagnetic sense layer;
(c) patterning the dielectric layer and ferromagnetic sense layer to demarcate magneto-resistive elements;
(d) performing an etch of the a dielectric layer; and,
(e) depositing a ferromagnetic pinned layer over the dielectric layer.

28. A method for constructing a magnetic random access memory, the method comprising the followings:
(a) depositing a ferromagnetic sense layer on a surface;
(b) depositing a metallic precursor of a tunnel dielectric over the ferromagnetic sense layer;
(c) patterning the ferromagnetic sense layer and metallic precursor to demarcate magneto-resistive elements;
(d) performing an etch of the metallic precursor in preparation for forming a dielectric layer;
(e) forming the dielectric layer from a portion of the metallic precursor remaining after performing the etch in step (d); and,
(f) depositing a ferromagnetic pinned layer over the dielectric layer.

* * * * *